United States Patent
Simons et al.

(10) Patent No.: US 10,475,630 B2
(45) Date of Patent: Nov. 12, 2019

(54) METAL OXIDE TARGET AND METHOD FOR PRODUCING SAID METAL OXIDE TARGET

(71) Applicant: Materion Advanced Materials Germany GmbH, Hanau (DE)

(72) Inventors: Christoph Simons, Biebergemünd (DE); Carl Christoph Stahr, Alzenau (DE); Jens Wagner, Frankfurt (DE)

(73) Assignee: MATERION ADVANCED MATERIALS GERMANY GMBH, Hanau (DE)

( * ) Notice: Subject to any disclaimer, the term of this patent is extended or adjusted under 35 U.S.C. 154(b) by 30 days.

(21) Appl. No.: 15/027,488

(22) PCT Filed: Oct. 6, 2014

(86) PCT No.: PCT/EP2014/071355
§ 371 (c)(1),
(2) Date: Apr. 6, 2016

(87) PCT Pub. No.: WO2015/052139
PCT Pub. Date: Apr. 16, 2015

(65) Prior Publication Data
US 2016/0260590 A1    Sep. 8, 2016

(30) Foreign Application Priority Data
Oct. 7, 2013    (DE) .................. 10 2013 016 529

(51) Int. Cl.
| | | |
|---|---|---|
| *H01J 37/34* | (2006.01) |
| *C23C 4/06* | (2016.01) |
| *C23C 4/11* | (2016.01) |
| *C23C 4/134* | (2016.01) |
| *C23C 14/08* | (2006.01) |
| *C23C 14/14* | (2006.01) |
| *C23C 14/34* | (2006.01) |
| *G02B 1/12* | (2006.01) |

(52) U.S. Cl.
CPC ............ *H01J 37/3429* (2013.01); *C23C 4/06* (2013.01); *C23C 4/11* (2016.01); *C23C 4/134* (2016.01); *C23C 14/08* (2013.01); *C23C 14/081* (2013.01); *C23C 14/082* (2013.01); *C23C 14/083* (2013.01); *C23C 14/14* (2013.01); *C23C 14/3414* (2013.01); *G02B 1/12* (2013.01); *H01J 37/3426* (2013.01)

(58) Field of Classification Search
CPC .............. H01J 37/3426; H01J 37/3429; C23C 14/3414; C23C 14/08; C23C 14/081; C23C 14/082; C23C 14/083; C23C 14/14; C23C 4/06; C23C 4/11; C23C 4/134; G02B 1/12

See application file for complete search history.

(56) References Cited

U.S. PATENT DOCUMENTS

| | | | |
|---|---|---|---|
| 6,193,856 B1 | 2/2001 | Kida et al. | |
| 6,677,063 B2 * | 1/2004 | Finley ................. | C03C 17/3417 427/376.2 |
| 7,993,503 B2 | 8/2011 | Nadaud et al. | |
| 2004/0258926 A1 | 12/2004 | Veerasamy | |
| 2006/0159933 A1 | 7/2006 | Disteldorf et al. | |
| 2007/0036986 A1 | 2/2007 | Chonlamaitri et al. | |
| 2010/0206725 A1 | 8/2010 | Zhang et al. | |
| 2011/0056824 A1 | 3/2011 | Chung et al. | |
| 2011/0081532 A1 | 4/2011 | Lu | |
| 2011/0212312 A1 | 9/2011 | Thomsen et al. | |
| 2012/0114976 A1 * | 5/2012 | Rou ...................... | C23C 14/185 428/826 |
| 2013/0220804 A1 * | 8/2013 | Arakawa ............... | C22C 1/0433 204/298.13 |

FOREIGN PATENT DOCUMENTS

| | | | |
|---|---|---|---|
| DE | 102005021927 A1 | 11/2006 | |
| DE | 102011075851 A1 | 11/2012 | |
| EP | 2584062 A1 | 4/2013 | |
| JP | 09012333 A * | 1/1997 | |
| JP | 2005272212 A * | 10/2005 | ............. C03C 3/091 |
| JP | 5154950 B2 | 2/2013 | |
| WO | 2011110584 A1 | 9/2011 | |
| WO | WO-2012077665 A1 * | 6/2012 | ........... C22C 1/0433 |

OTHER PUBLICATIONS

International Search Report (with English translation) and Written Opinion dated Dec. 11, 2014 in International Application No. PCT/EP2014/071355.
Office Action (with partial English translation) dated Jul. 11, 2014 in DE Application No. 102013016529.6.

* cited by examiner

*Primary Examiner* — Michael A Band
(74) *Attorney, Agent, or Firm* — Fay Sharpe LLP

(57) ABSTRACT

A sputtering target for the production of layers such as optical layers, the layers produced by the target, and a method for producing the target are described. In addition to Si or a combination of Si and Al, the sputtering target contains metal oxide(s), a combination of at least two metal oxides, or a combination containing at least one metal oxide in the form of an alloy or in the form of a mixture. The sputtering target has a metal oxide fraction generated by the Si and Al and the metal oxide(s) or the combination thereof. Preferably, the metal oxide in the sputtering target is a metal oxide selected from $ZrO_2$, $Ta_2O_5$, $Y_2O_3$, HfO, CaO, MgO, $Ce_2O_3$, $Al_2O_3$, $TiO_2$ and $Nb_2O_5$.

2 Claims, No Drawings

METAL OXIDE TARGET AND METHOD FOR PRODUCING SAID METAL OXIDE TARGET

CROSS-REFERENCE TO RELATED APPLICATIONS

This application is a Section 371 of International Application No. PCT/EP2014/071355, filed Oct. 6, 2014, which was published in the German language on Apr. 16, 2015 under International Publication No. WO 2015/052139 A1, and the disclosure of which is incorporated herein by reference.

BACKGROUND OF THE INVENTION

A Zr target that is used for the production of scratch-proof cover layers is known from US 2011/0212312 A1, which describes a layer system comprising a protective $ZrO_2$ cover layer.

A zirconium-containing target for the production of particularly stable layers is known from US 2007/0036986 A1, which describes an infrared-reflecting single-Ag layer system comprising a ZrSiOxNy layer (ZrSiOxNy=ZrSi-oxygen-nitrogen compound), i.e., a ZrSi oxynitride layer. The layer system is produced by sputtering a ZrSi target in an oxygen- and nitrogen-containing atmosphere. The layer system provided with this layer is characterized by improved service life and durability.

A layer system with a $TiO_2$:$ZrO_2$ layer that comprises mechanical and chemical resistance of pyrolytic layers is known from WO 2011/110584 A1.

A target is known from US 2006/0159933 A1. The layer produced by the target is a UV-blocking layer system with a ZrSiOxNy layer as a cover layer and a NbZrOx layer as an intermediate layer. The layers can be produced by sputtering technology using SiZr and NbZr targets.

An NbZr target is known from US 2004/0258926 A1, whereby the layers contain an infrared-reflecting double-Ag layer system. The NbZr layers are produced through the use of an NbZr target, whereby the layer system is characterized by improved service life and durability.

Moreover, a target consisting of the elements Al, Si, ZrSi is known from JP 05154950 B2. In this context, the Zr is used in the form of a ZrSi compound.

The prior art and the corresponding sputtering targets described above are disadvantageous in that the powder used in the production of SiZr-based systems, for example the Zr or ZrSi powder, is associated with a potential ignition and burn risk due to the exothermic metallic nature of the powder. Moreover, the production of the corresponding powder is resource-consuming and expensive.

BRIEF SUMMARY OF THE INVENTION

It is therefore the object of the invention, inter alia, to develop a sputtering target that is easy, safe and simple to handle.

The invention thus relates to a sputtering target for the production of layers, in particular of optical layers. The invention also relates to a layer, in particular an optical layer, and a device for producing a sputtering target. Moreover, the invention relates to a method for producing a sputtering target.

The object of the invention is met by a sputtering target comprising Si and Al or an Si—Al alloy and at least one metal oxide, a combination of at least two metal oxides, or a combination comprising at least one metal oxide in the form of an alloy or in the form of a mixture, such that a sputtering target having a metal oxide fraction is generated by the Si and Al or the alloy thereof and by the at least one metal oxide.

The object of the invention is further met by a sputtering target comprising Si or an Si alloy, in that the sputtering target further comprises at least one metal oxide, a combination of at least two metal oxides, or a combination comprising at least one metal oxide in the form of an alloy or in the form of a mixture, such that a sputtering target having a metal oxide fraction is generated by the element Si or the alloy thereof and by the at least one metal oxide or the combination thereof.

DETAILED DESCRIPTION OF THE INVENTION

An advantage of using the metal oxides specified above is that the use of a metal oxide, in particular $ZrO_2$, as a Zr carrier component is less expensive than using an Si—Zr compound or pure, non-oxidized Zr powder since the metal oxide, in particular $ZrO_2$, is quite readily commercially available and is easy to handle. Moreover, the potential ignition and fire risk of the oxidic powder in the form of a metal oxide, for example $ZrO_2$, is reduced or typically even prevented. Lastly, the use of at least one metal oxide fraction in a target results in improved mechanical strength and chemical resistance compared with sputtered layers known from the prior art. Moreover, mechanically and chemically stable optical layers can be produced by the oxidized Zr and/or oxidized Zr compound as respective alloying element.

In an advantageous embodiment of the sputtering target having an Si fraction and an Al fraction, the metal oxide in the sputtering target is a metal oxide selected from $ZrO_2$, $Ta_2O_5$, $Y_2O_3$, HfO, CaO, MgO, $Ce_2O_3$, $Al_2O_3$, $TiO_2$ and $Nb_2O_5$. Accordingly, it is feasible to combine multiple metal oxides in a sputtering target according to the invention, for example a $ZrO_2$ metal oxide with a $TiO_2$ fraction.

In a further advantageous embodiment of the sputtering target having an Si fraction and an Al fraction, the metal oxide is a combination of $ZrO_2$ and $Y_2O_3$.

In a further advantageous embodiment of the sputtering target having an Si fraction and an Al fraction, the aluminum content ranges from 1 to 35 at %, preferably from 5 to 30 at %, particularly preferably from 10 to 20 at % or from 5 to 10 at %.

In a further advantageous embodiment of the sputtering target having an Si fraction and an Al fraction, the metal oxide content ranges from 10 to 50 mol %, preferably from 10 to 20 mol % or 20 to 40 mol %.

In a further advantageous embodiment of the sputtering target with an Si fraction and an Al fraction, the oxide alloy $ZrO_2$:$Y_2O_3$ has a $Y_2O_3$ fraction ranging from 4 to 8 mol % in the oxide alloy.

In an advantageous embodiment of the sputtering target having an Si fraction, the metal oxide in the sputtering target is a metal oxide selected from $ZrO_2$, $Ta_2O_5$, $Y_2O_3$, HfO, CaO, MgO, $Ce_2O_3$, $Al_2O_3$, $TiO_2$ and $Nb_2O_5$. Accordingly, it is feasible to combine multiple metal oxides in a sputtering target according to the invention, for example a $ZrO_2$ metal oxide with a $TiO_2$ fraction.

In a further advantageous embodiment of the sputtering target having an Si fraction and an Al fraction, the metal oxide is a combination of $ZrO_2$ and $Y_2O_3$.

In a further advantageous embodiment of the sputtering target having an Si fraction, the metal oxide content ranges from 10 to 50 mol %, preferably from 10 to 20 mol % or from 20 to 40 mol %.

In a further advantageous embodiment of the sputtering target having an Si fraction, the oxide alloy $ZrO_2$:$Y_2O_3$ has a $Y_2O_3$ fraction ranging from 4 to 8 mol % in the oxide alloy.

Moreover, the invention relates to a layer, in particular an optical layer, produced by a sputtering target according to embodiments of the invention.

Moreover, the invention relates to a device for producing a sputtering target according to embodiments of the invention, characterized in that the device comprises suitable means for producing the sputtering target.

The invention also relates to a method for producing a sputtering target according to embodiments of the invention using such a device.

Moreover, the invention relates to a method producing a sputtering target according to embodiments of the invention, characterized in that a plasma spraying method is used as the production method, wherein the powder mixture comprises the elements Si and Al, or an alloy made of Si and Al
and at least one metal oxide or the element Si, or an alloy made of Si
and at least one metal oxide.

It is preferred to produce a sputtering target, preferably a tube target, by producing a sputtering target between 0.1 m and 10 m in length, preferably approximately 3 to 4 m in length, with a layer thickness of 2 to 20 mm, preferably 5 to 15 mm, by plasma spraying technique, whereby an Si powder, Al powder, and a metal oxide powder or an Si powder and a metal oxide powder, preferably each in the form of metal oxide powder having a $ZrO_2$ fraction, is used as powder for the plasma spraying technique, whereby the spraying powder comprises the following properties:

(a) for production of an Si—Al metal oxide sputtering target:
Si powder with a mean grain size of 60 to 90 µm, preferably 75 µm;
Al powder with a mean grain size of 45 to 75 µm, preferably 60 µm; and
metal oxide powder, preferably metal oxide powder having a $ZrO_2$ fraction, with a mean grain size of 15 to 45 µm, preferably 30 µm;

or (b) for production of an Si metal oxide sputtering target:
Si powder with a mean grain size of 60 to 90 µm, preferably 75 µm; and
metal oxide powder, preferably metal oxide powder having a $ZrO_2$ fraction, with a mean grain size of 15 to 45 µm, preferably 30 µm.

Moreover, a gas mixture, preferably a mixture of argon and hydrogen, is used during the plasma spraying process.

For evaluation of the sputtering behavior, the sputtering targets according to the invention are sputtered in un-pulsed or pulsed DC (direct current) operation and the sputtering behavior is compared to that of a standard target, such as, for example, an SiAl 10 wt. % target. The main point of comparison in this context is the occurrence of an arcing behavior of the target.

As an alternative to DC operation, it is feasible to sputter the target according to the invention by MF (medium frequency) operation or RF (radio frequency) operation and to do the comparison, if applicable.

It is particularly preferred according to the invention, to use an $SiAlZrO_2$ target produced from three powder components, namely Si, Al and $ZrO_2$ or, alternatively, $Y_2O_3$-stabilized $ZrO_2$.

In the course of the production of the particularly preferred target by plasma spraying, a target material comprising at least the phases, Si, Al, and $ZrO_2$ is generated. The target material thus produced shows good sputtering ability in the DC process despite the use of the electrically insulating and non-conductive zirconium $ZrO_2$. The arcing behavior of the target is comparable to that of a reference target comprising reference fractions in the form of SiAl or Si fractions.

The explanations provided above with regard to the production of a sputtering target or the DC sputtering behavior or the arcing behavior are also applicable and transferable to Si targets or Si—Al targets having a metal oxide fraction that do not have a $ZrO_2$ fraction. Alternatively, the explanations provided above can be transferred to the sputtering with MF operation or RF operation if an Si target or an Si—Al target having a metal oxide fraction is used, neither of which has a $ZrO_2$ fraction.

The specifications made above in units of at % (atom-%), mol % (mol-%), and wt % (wt.-% or % by weight) shall alternatively be interpreted to include common variations due to the production procedure.

The sputtering targets having an Si fraction according to the invention or an Al fraction may be provided in the form of a tube target or a planar target.

In the particularly preferred embodiment of a sputtering target having an Si fraction and an Al fraction with a $ZrO_2$ metal oxide fraction, it is particularly preferred to use larger fractions of $ZrO_2$.

Alternatively, the $ZrO_2$ used in the sputtering targets according to the invention is yttrium-stabilized $ZrO_2$. According to the invention, it is preferred to use a non-stabilized $ZrO_2$ in the target according to the invention.

The corresponding sputtering targets according to the invention possibly comprise inevitable impurities that have no influence on the properties of the corresponding alloy of the sputtering target.

A number of exemplary embodiments that have proven to be particularly well-suited shall be described in the following.

EXAMPLES

The preferred alloys of sputtering targets according to the invention are listed in the table below, which also contains the sputtering behavior.

| Experiment Number | Sputtering Target | Sputtering Behavior | Comment |
|---|---|---|---|
| 1 | SiAl10 wt % | good | |
| 2 | $SiZrO_2$35 wt % | moderate | |
| 3 | $SiZrO_2$50 wt % | moderate | |
| 4 | $SiZrO_2$70 wt % | moderate | |
| 5 | $SiZrO_2$80 wt % | possible | |
| 6 | SiAl5$ZrO_2$35 wt % | good | |
| 7 | SiAl5$ZrO_2$45 wt % | good | |
| 8 | SiAl5$ZrO_2$50 wt % | good | |
| 9 | SiAl5$ZrO_2$60 wt % | good | |
| 10 | SiAl5$ZrO_2$70 wt % | moderate | |
| 11 | SiAl5$ZrO_2$80 wt % | possible | |
| 12 | SiAl10$ZrO_2$50 wt % | good | |
| 13 | SiAl10$ZrO_2$70 wt % | moderate | |
| 14 | SiAl10$ZrO_2$80 wt % | possible | |

-continued

| Experiment Number | Sputtering Target | Sputtering Behavior | Comment |
|---|---|---|---|
| 15 | SiAl5TiO$_2$10ZrO$_2$50 wt % | moderate | |
| 16 | SiAl5Y:ZrO$_2$35 wt % | good | Y: ZrO$_2$ = Y$_2$O$_3$ 8 mol %: ZrO$_2$ |

The production of three sputtering targets is described for exemplary purposes in the following, whereby the dimension of 0.5 m is an experimental target.

An SiAl5ZrO$_2$ 35 wt. % target (Experiment 6) 0.5 m in length is produced in the form of a tube target by the plasma spraying technique using Si powder, Al powder, and ZrO$_2$ powder fractions. A spraying powder having the following properties is used in the course of the plasma spraying, namely the mean grain size of the Si powder being 35 μm, the mean grain size of the Al powder being 60 μm, and the mean grain size of the ZrO$_2$ powder being 30 μm.

In this context, the plasma spraying process for production of an SiAl5ZrO$_2$ 35 wt. % target is carried out with a mixture of argon and hydrogen as plasma gas, for example, in a device according to the invention.

Alternatively, it is feasible to produce an SiAl5ZrO$_2$ 50 wt. % tube target (Experiment 8) in accordance with the description provided above by the plasma spraying technique using powders comprising the above-mentioned grain sizes, but with differing fractions.

It is feasible to sputter both targets described above in a DC process.

The two targets described above show the same behavior as a standard target, such as, for example, an SiAl 10 wt. % target. Likewise, each of the two targets has a similarly low arcing rate in the sputtering process compared with the reference target, such as, for example, a standard target with SiAl 10 wt. %.

Alternatively, the method for producing a sputtering target and the device according to the invention allow an SiAl5Y:ZrO$_2$35 wt. % target (Experiment 16) 0.5 m in length to be produced by the plasma spraying technique using Si powder, Al powder, and Y$_2$O$_3$:ZrO$_2$ powder fractions. The ZrO$_2$ powder is yttrium-stabilized in this context.

This sputtering target, produced according to the invention, having a yttrium-stabilized ZrO$_2$ fraction of 35 wt. % results in the same DC sputtering behavior and arcing rate behavior compared with a reference target, such as an SiAl 10 wt. % target.

Alternatively, it is feasible according to the invention to sputter and compare the exemplary embodiments specified above by MF operation or RF operation.

Alternatively, it is feasible to produce and sputter the experimental targets 0.5 m in length in the form of targets, preferably tube targets, of approximately 3 m to approximately 4 m in length. Accordingly, it is feasible that the sputtering targets from the above table have a length of, for example, approximately 4 m.

It is feasible to sputter an optical layer in a DC procedure by a sputtering target according to the invention.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A sputtering target for producing layers, wherein the sputtering target consists of (A) (i) the elements Si and Al or (ii) an Si—Al alloy and (B) (i) at least one metal oxide, (ii) at least one combination of at least two metal oxides, or (iii) a combination comprising at least one metal oxide that is an alloy or a mixture;
   wherein the sputtering target has a metal oxide content ranging from 10 to 20 mol %;
   wherein the sputtering target has an aluminum content ranging from 1 to 35 at %; and
   wherein the at least one metal oxide is selected from ZrO$_2$, Ta$_2$O$_5$, Y$_2$O$_3$, HfO, CaO, MgO, Ce$_2$O$_3$, TiO$_2$, and Nb$_2$O$_5$.

2. The sputtering target of claim 1, wherein the sputtering target has an aluminum content of 5 to 30 at %.

* * * * *